(12) United States Patent
Komatsu et al.

(10) Patent No.: US 7,382,122 B2
(45) Date of Patent: Jun. 3, 2008

(54) MAGNETIC SENSOR

(75) Inventors: Akio Komatsu, Aki (JP); Masakane Nagaki, Kochi (JP)

(73) Assignee: Kabushiki Kaisha Minerva, Kami-gin (JP)

( * ) Notice: Subject to any disclaimer, the term of this patent is extended or adjusted under 35 U.S.C. 154(b) by 114 days.

(21) Appl. No.: 10/567,673

(22) PCT Filed: Aug. 12, 2004

(86) PCT No.: PCT/JP2004/011608

§ 371 (c)(1),
(2), (4) Date: Feb. 9, 2006

(87) PCT Pub. No.: WO2005/017547

PCT Pub. Date: Feb. 24, 2005

(65) Prior Publication Data

US 2006/0202691 A1    Sep. 14, 2006

(30) Foreign Application Priority Data

Aug. 19, 2003  (JP) .............................. 2003-295185

(51) Int. Cl.
| | |
|---|---|
| G01B 7/14 | (2006.01) |
| H01L 43/08 | (2006.01) |
| G01N 27/72 | (2006.01) |
| G01R 33/09 | (2006.01) |
| G06K 7/08 | (2006.01) |

(52) U.S. Cl. .................. 324/252; 324/207.21; 324/225; 235/449

(58) Field of Classification Search ........... 324/207.12, 324/207.2, 207.21, 207.25, 207.26, 225, 324/251, 252, 207.24, 207.23; 338/32 R, 338/32 H; 235/449, 450

See application file for complete search history.

(56) References Cited

U.S. PATENT DOCUMENTS

| | | | | |
|---|---|---|---|---|
| 4,574,190 | A | * 3/1986 | Nishimura | ................... 235/449 |
| 4,673,827 | A | * 6/1987 | Sommer | ..................... 307/116 |
| 4,754,190 | A | * 6/1988 | Hinotami et al. | ........... 313/422 |
| 4,853,632 | A |   8/1989 | Nagano et al. | |
| 4,893,027 | A | * 1/1990 | Kammerer et al. | ......... 307/116 |
| 5,128,613 | A | * 7/1992 | Takahashi | .................... 324/235 |
| 5,545,983 | A | * 8/1996 | Okeya et al. | ........... 324/207.12 |
| 6,690,158 | B2 * | 2/2004 | Saito et al. | ............. 324/207.21 |

FOREIGN PATENT DOCUMENTS

| | | | |
|---|---|---|---|
| JP | 57-131013 A | | 8/1982 |
| JP | 06-018278 A | | 1/1994 |
| JP | 11-316134 A | | 11/1999 |
| JP | 2001014029 | * | 1/2001 |

* cited by examiner

*Primary Examiner*—Reena Aurora
*Assistant Examiner*—Kenneth J Whittington
(74) *Attorney, Agent, or Firm*—Frishauf, Holtz, Goodman & Chick, P.C.

(57) ABSTRACT

A magnetic sensor includes a pair of serially-connected magneto-resistive elements (1a, 1b), one of which serves as a sensing portion (6) made to face a magnetic detecting medium (S), and the other of which serves as a temperature-compensating portion (7). The magnetic sensor also includes a magnet (5) that gives magnetic biases having different types of magnetism to the magneto-resistive elements (1a, 1b), and a detection circuit (8) that applies DC voltage to between ends of the serially-connected magneto-resistive elements (1a, 1b) and detects a potential change of the common connection point of the magneto-resistive elements (1a, 1b).

1 Claim, 5 Drawing Sheets

MAGNETIC SENSOR

This application is a U.S. National Phase Application under 35 USC 371 of International Application PCT/JP2004/011608 filed Aug. 12, 2004.

TECHNICAL FIELD

The invention relates to a magnetic sensor for detecting magnetic variables, and more specifically to a magnetic sensor for detecting the condition of a magnetic substance printed on a papyraceous and foliate medium by using magneto-resistive elements.

BACKGROUND ART

Conventionally, the printing (application) of a magnetic substance (magnetic ink) onto paper money and the like in the prescribed pattern has been practiced. For example, banking machines including automated teller machines and the like, dispensers, and ticket-vending machines detect the condition of the magnetic substance provided in the prescribed pattern to paper money dropped in each machine or the like by using a magnetic sensor built in each machine, and makes a determination as to whether the paper money or the like is real or false from a magnetic pattern that is detected.

A magnetic sensor of this type uses, for example, a magneto-resistive element (magneto-resistive effect element: MR element). This magnetic sensor catches a change in a magnetic field and the presence of a magnetic substance as a change of the electric resistance value of the magneto-resistive element. To this end, in the magnetic sensor using a magneto-resistive element, the magnetic biasing for providing magnetic flux beforehand to the magneto-resistive element with a permanent magnet is carried out. The magneto-resistive element is used in an area where the strength of the magnetic field and the resistance value have a linear relationship due to the magnetic bias.

Figure 1A:
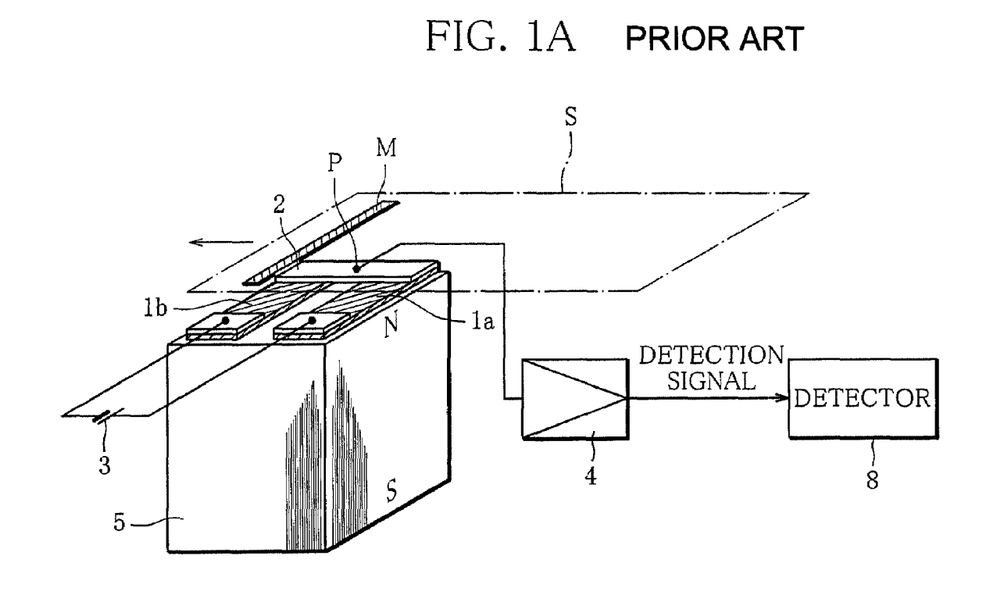
FIG. 1A is a perspective view showing a conventional magnetic sensor using a magneto-resistive element.
Figure 1B:
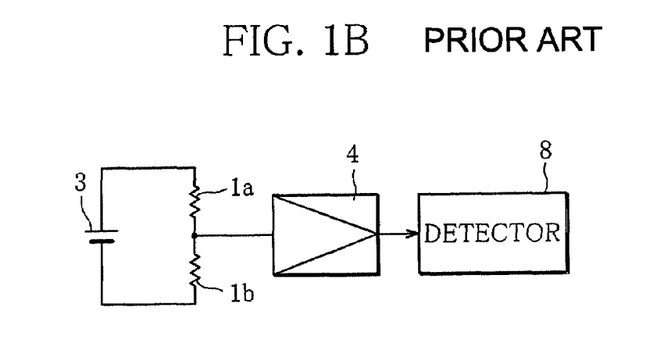
FIG. 1B is a view showing an electric equivalent circuit of the magnetic sensor illustrated in FIG. 1A.

A magneto-resistive element of this type has high temperature dependency. For this reason, two magneto-resistive elements are used in a serially-connected state for the purpose of counteracting the temperature dependency. To be specific, in a magnetic sensor disclosed in Unexamined Japanese Patent Publication No. 6-18278, two (a pair of) magneto-resistive elements 1a and 1b are connected in series with each other through an electrode 2 as illustrated in FIG. 1A. A common connection point P of the electrode 2 serves as a detection terminal. The magneto-resistive elements are provided with flux (magnetic biases) having the same magnetism, which are emitted from a magnet 5. In an electric equivalent circuit shown in FIG. 1A, the two magneto-resistive elements 1a and 1b are connected in series with each other as illustrated in FIG. 1B, and voltage of a DC power source 3 is given to between both ends thereof. Further connected to the electric equivalent circuit is an amplifier 4 for amplifying the potential level of the common connection point P of the magneto-resistive elements 1a and 1b. A potential change signal of the common connection point P, which is amplified by the amplifier 4, is transmitted to a detector 8 for discriminating, for example, the kinds of paper money.

According to this magnetic sensor, DC voltage is applied to between both terminals of the serially-connected magneto-resistive elements 1a and 1b by using the DC power source 3. The amplifier 4 amplifies the potential change of the common connection point P of the magneto-resistive elements 1a and 1b. The magnetic sensor detects the condition (pattern) of the magnetic ink (magnetic substance) printed, for example, on paper money, from the amplified potential change. In other words, this magnetic sensor moves a detection subject S on which a magnetic substance M is printed while bringing the detection subject S close to the magneto-resistive elements 1a and 1b, to thereby detect the condition (pattern) of the magnetic substance M.

For instance, FIG. 1A shows that the detection subject S on which the magnetic substance M is printed in stripes is brought close to the magneto-resistive elements 1a and 1b of the magnetic sensor, and at the same time it is moved at the prescribed speed in the direction intersecting the flux emitted from the magnet 5. As illustrated in this figure, the more the magnetic substance M printed on the detection subject S approaches the magneto-resistive element 1a, the more the flux emitted from the permanent magnet 5 converges upon the magnetic substance M. As a result, the flux passing through the magneto-resistive element 1a grows larger. That is to say, the resistance value of the magneto-resistive element 1a is increased, which lowers the potential of the common connection point P.

When the magnetic substance M draws apart from the magneto-resistive element 1a while getting close to the magneto-resistive element 1b, the flux passing through the magneto-resistive element 1a is decreased. Accordingly, the magneto-resistive element 1a is reduced in its resistance value. At the same time, the magnetic substance M approaches the magneto-resistive element 1b, and the flux passing through the magneto-resistive element 1b grows larger. At this point, the resistance value of the magneto-resistive element 1b is increased. This raises the potential of the common connection point P.

On that account, the potential of the common connection point P is, as illustrated in FIG. 1A, gradually reduced as the magnetic substance M printed on the detection subject S in stripes approaches the magneto-resistive element 1a. On the other hand, as the magnetic substance M draws apart from the magneto-resistive element 1a and gets close to the magneto-resistive element 1b, the potential of the common connection point P is increased by degree. When the magnetic substance M draws apart from the magneto-resistive element 1b, the potential of the common connection point P returns to the potential in the initial state. Basically, in magneto-resistive element 1b having the above structure, the potential of the common connection point P has a value different from that of the potential in the steady state along with the displacement of the magnetic substance M. To be concrete, in response to the displacement of the magnetic substance M, the potential of the common connection point P is brought into the state lower than the potential in the steady state (when the magnetic substance M applied to the detection subject S approaches the magneto-resistive element 1a) and the state higher than the potential in the steady state (when the magnetic substance M applied to the detection subject S approaches the magneto-resistive element 1b).

The potential is brought into the low state and the high state along with the displacement of the detection subject on the basis of the potential in the steady state at the common connection point of the serially-connected magneto-resistive elements. This causes the problem that the magnetic sensor for detecting the width of the magnetic substance printed on the detection subject has to include an intricate detection circuit. Moreover, when the front or rear edge of the detection subject reaches the magnetic sensor, the potential is in the low state and the high state. On the other hand, the potential during the magnetic substance passes above the magnetic sensor is equal to the potential without the magnetic substance. As a consequence, there has been the problem that the magnetic sensor has difficulty even in detecting the concentration of the magnetic substance printed on the detection subject.

DISCLOSURE OF THE INVENTION

The invention has been made in light of the foregoing circumstances, and an object thereof is to provide a magnetic sensor capable of easily and reliably detecting the width and concentration of a magnetic substance printed on a detection subject.

To accomplish the above object, the magnetic sensor according to the invention has a pair of serially-connected magnetic detecting elements, one of which serves as a sensing portion made to face a magnetic detecting medium, and the other as a temperature-compensating portion that is not affected by magnetism of the magnetic detecting medium; a magnet that gives magnetic biases to the magnetic detecting elements; and a detection circuit that applies DC voltage to between both ends of the serially-connected magnetic detecting elements and detects a potential change of a common connection point of the magnetic detecting elements.

Alternatively, the magnetic sensor according to the invention forms a bridge circuit from first and second fixed resistors connected in parallel with an output line of a DC power source, a first magnetic detecting element serving as a sensing portion that is connected in series with the first fixed resistor and made to face a magnetic detecting medium, and a second magnetic detecting element serving as a temperature-compensating portion that is connected in series with the second fixed resistor and is not affected by magnetism of the magnetic detecting medium.

Furthermore, the magnetic sensor has a magnet that gives magnetic biases to the first and second magnetic detecting elements, and a detection circuit that detects a potential change between a connection point of the first fixed resistor and the first magnetic detecting element a connection point of the second fixed resistor and the second magnetic detecting element.

Consequently, the magnetic sensor according to the invention performs temperature compensation with respect to the magnetic detecting element of the sensing portion by using the temperature-compensating portion that is not affected by the magnetic detecting medium, and at the same time detects the condition of the magnetic detecting medium (magnetic substance). Therefore, the magnetic sensor according to the invention has practically significant advantages such as a capability to reliably detect the width and concentration of the magnetic substance printed on the detection subject in spite of a simple structure.

BEST MODE OF CARRYING OUT THE INVENTION

A magnetic sensor according to one embodiment of the invention will be described below with reference to the drawings.

Embodiment 1

Figure 3:
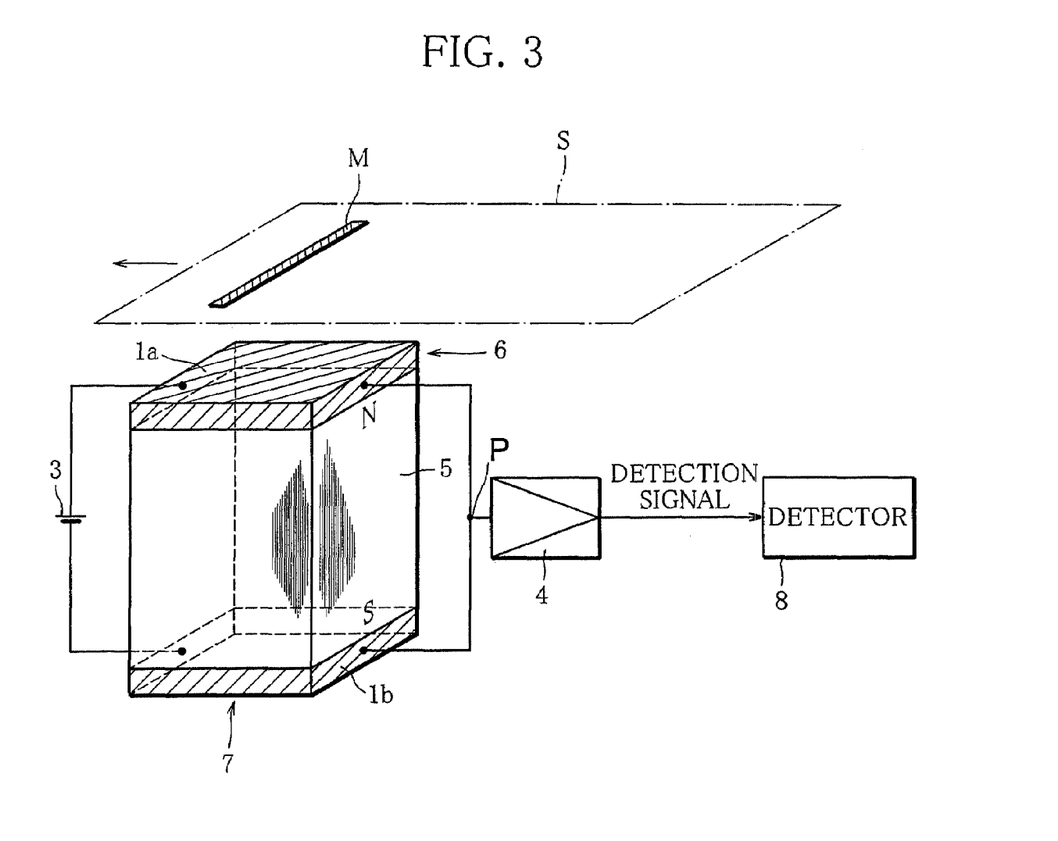
FIG. 3 is a perspective view showing a general structure of a magnetic sensor according to one embodiment of the invention.

FIG. 3 is a perspective view showing a general structure of a first embodiment (embodiment 1) of the magnetic sensor according to the invention. Members shown in FIG. 3, which are the same as those in a structure shown in FIGS. 1A and 1B, are provided with the same reference numerals as those in FIGS. 1A and 1B, and an explanation thereof will be roughly provided.

In this figure, $1a$ and $1b$ are magnetic detecting elements. These magnetic detecting elements $1a$ and $1b$ are characterized in that electric resistance values thereof change depending on the strength of a magnetic field of a place in which the elements are located. For example, magneto-resistive elements are utilized as the magnetic detecting elements $1a$ and $1b$. In this magnetic sensor, a pair of magneto-resistive elements (magnetic detecting elements) $1a$ and $1b$ having the same characteristics are connected in series with each other. The magnetic sensor is provided with a magnet 5 that gives magnetic biases of magnetism to the pair of magneto-resistive elements $1a$ and $1b$. The magnet 5 may be either a permanent magnet or electromagnet. In effect, the magnet 5 may be anything as long as it gives magnetic biases to the magneto-resistive elements $1a$ and $1b$.

DC voltage is applied by a DC power source 3 to between both ends of the serially-connected magneto-resistive elements $1a$ and $1b$. Connected to a common connection point P of the magneto-resistive elements $1a$ and $1b$ is an amplifier 4 that amplifies a potential change signal thereof. An output signal of the amplifier 4 is transmitted to a detector 8 that, for example, discriminates the kinds of paper money on which the magnetic substance M is printed. The detector 8 makes a determination as to whether paper money or the like is real or false from a change (change pattern) of the output signal that is outputted by the amplifier 4. An electric equivalent circuit of a magnetic sensor shown in FIG. 3 is similar to a conventional magnetic sensor illustrated in FIG. 1B.

In the magnetic sensor thus constructed, although details will be provided later, the magneto-resistive element $1a$ functions as a sensing portion 6 that detects the magnetic substance M printed on a magnetic detecting medium (detection subject) S such as paper money in magnetic ink. The magneto-resistive element $1b$ serially connected to the magneto-resistive element $1a$ is disposed so that it is not affected by magnetism of the magnetic substance, and functions as a temperature-compensating portion 7 that compensates a temperature characteristic of the magneto-resistive element $1a$ provided to the sensing portion 6.

Basically, in respect of the magnetic sensor thus constructed, the invention has the following characteristics.

The first point is that the pair of magneto-resistive elements $1a$ and $1b$ is provided with magnetic biases having different types of magnetism.

The second point is that the magneto-resistive element $1a$ is designed to serve as the sensing portion 6, and the magneto-resistive element $1b$ as the temperature-compensating portion 7.

That is to say, the sensing portion 6 has the magneto-resistive element $1a$ made to face the magnetic detecting medium S. The temperature-compensating portion 7 includes the magneto-resistive element $1b$ that compensates the temperature characteristic of the magneto-resistive element $1a$ of the sensing portion 6.

In the magnetic sensor thus constructed, the magnetic detecting medium (for example, paper money printed in magnetic ink) S is brought close to the magneto-resistive element $1a$ of the sensing portion 6 to face the magneto-resistive element $1a$. During this process, the paper money S is displaced at prescribed speed, and the magnetic substance M printed on the paper money S intersects flux emitted from the magnet 5. The flux emitted from the magnet 5 then converges upon the magnetic substance M printed on the paper money S. Therefore, the flux passing through the magneto-resistive element $1a$ of the sensing portion 6 grows larger when the magnetic substance M intersects the magneto-resistive element $1a$. Consequently, an electric resistance value of the magneto-resistive element $1a$ is increased.

The magneto-resistive element $1b$ of the temperature-compensating portion 7 is disposed farther from the paper money S than the magneto-resistive element $1a$ of the sensing portion 6 is. For this reason, the flux of the temperature-compensating portion 7 is scarcely affected by the magnetic substance M printed on the paper money S. Therefore, an electric resistance value of the magneto-resistive element $1b$ of the temperature-compensating portion 7 hardly changes. Accordingly, the presence and concentration of the magnetic substance M printed on the paper money S are detected only by the magneto-resistive element $1a$ of the sensing portion 6.

Figure 2:
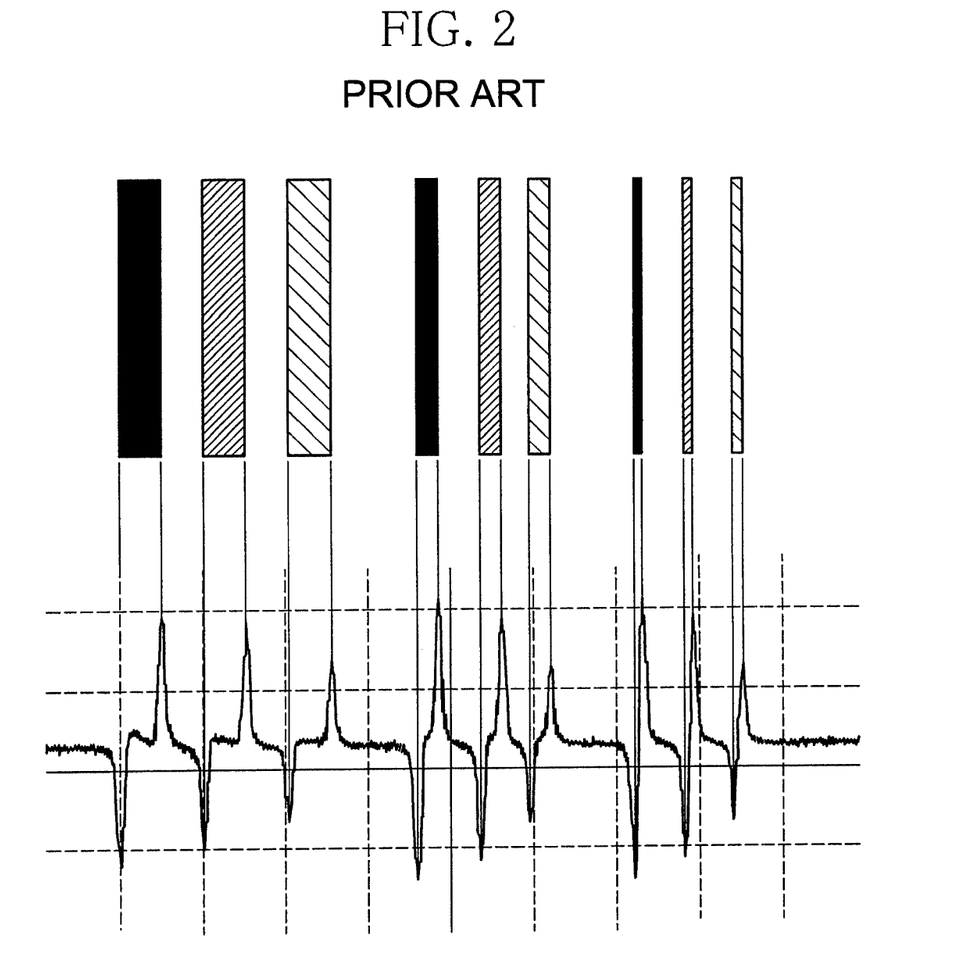
FIG. 2 is a view showing one example of a magnetic detecting medium on which a magnetic substance is printed in stripes and a detection signal outputted from the conventional magnetic sensor illustrated in FIG. 1.
Figure 4:
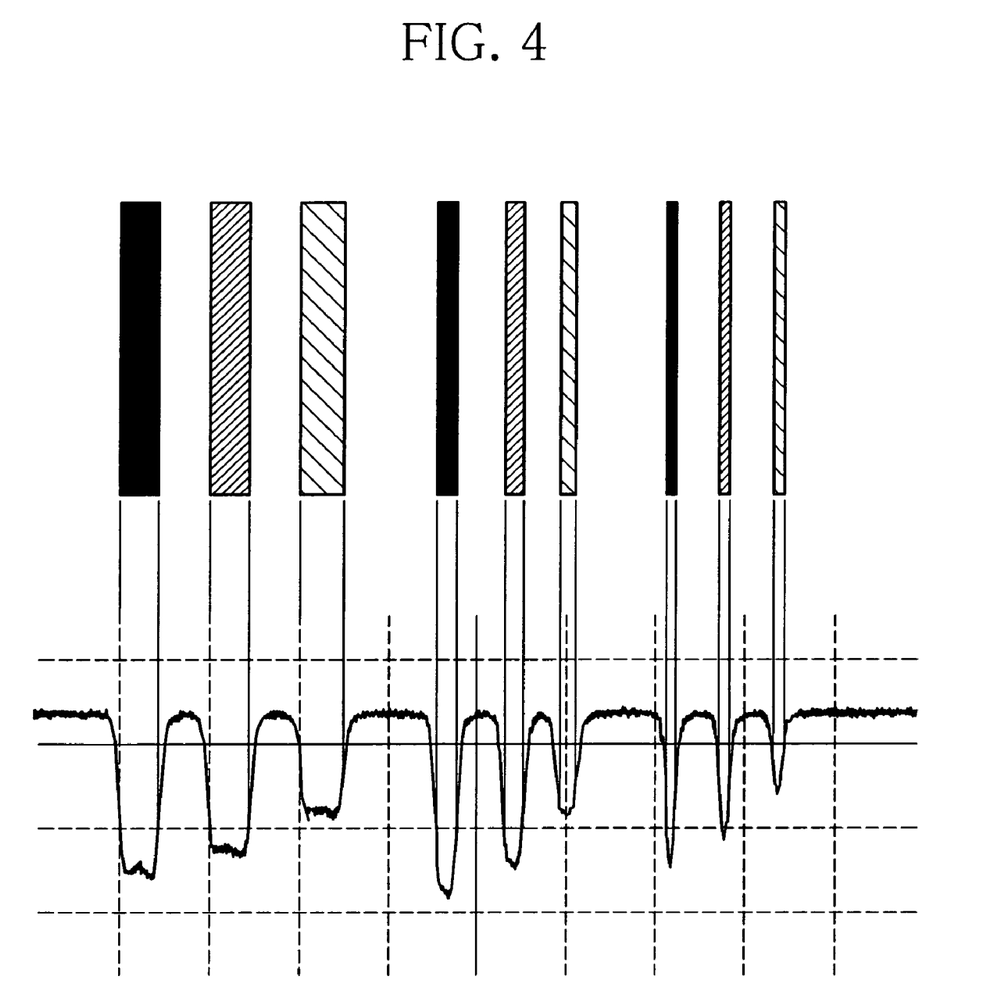
FIG. 4 is a view showing one example of a detection signal outputted from the magnetic sensor illustrated in FIG. 3.

Specifically, the magnetic detecting medium S on which the magnetic substance M is printed in stripes, for example, as illustrated in FIG. 2, is brought close to the magneto-resistive element $1a$ of the sensing portion 6. Simultaneously, the magnetic detecting medium S is displaced at prescribed speed so as to intersect the flux emitted from the magnet 5. As a result, the potential of the common connection point P of the magneto-resistive elements $1a$ and $1b$ changes as illustrated in FIG. 4.

In other words, if an area in which the magnetic substance M is printed on the magnetic detecting medium S approaches the magneto-resistive element $1a$ of the sensing portion 6 shown in FIG. 3, the flux emitted from the magnet 5 converges upon this area of the magnetic substance M. This increases the electric resistance value of the magneto-resistive element $1a$. In contrast, the electric resistance value of the magneto-resistive element $1b$ disposed on the temperature-compensating portion 7 side is not affected by the magnetic substance M printed on the magnetic detecting medium S.

Consequently, the electric resistance value thereof hardly changes. In result, the potential of the common connection point P of the serially-connected magneto-resistive elements $1a$ and $1b$ is lowered due to the increase of the electric resistance value of the magneto-resistive element $1a$. The electric resistance value of the magneto-resistive element $1a$ of the sensing portion 6 is returned to an initial value when the magnetic substance M printed on the magnetic detecting medium S draws apart from the magneto-resistive element $1a$.

Thereafter, the potential of the common connection point P of the magneto-resistive elements $1a$ and $1b$ repeatedly changes in response to the proximity and remoteness of the magnetic substance M printed in stripes.

The electric resistance value of the magneto-resistive element $1a$ changes according to the print pitch and width of the magnetic substance M printed on the magnetic detecting medium S. Therefore, the potential of the common connection point P of the serially-connected magneto-resistive elements $1a$ and $1b$ changes (the potential drops) according to the print pitch and width of the magnetic substance M. In other words, the print width of the magnetic substance M can be found by integrating duration in which the potential of the common connection point P is equal to or less than a prescribed threshold value and displacement speed of the magnetic detecting medium S.

When an area in which the concentration of the magnetic substance M is high approaches the magneto-resistive element $1a$, the flux passing through the magneto-resistive element $1a$ grows larger. Along with the increase of the flux, the resistance value of the magneto-resistive element $1a$ is increased. To be short, the potential of the common connection point P is drastically lowered. In other words, the potential of the common connection point P is proportional to the concentration of the magnetic substance M. As a consequence, the magnetic sensor according to the one embodiment of the invention is capable of detecting the concentration of the magnetic substance M.

Figure 5:
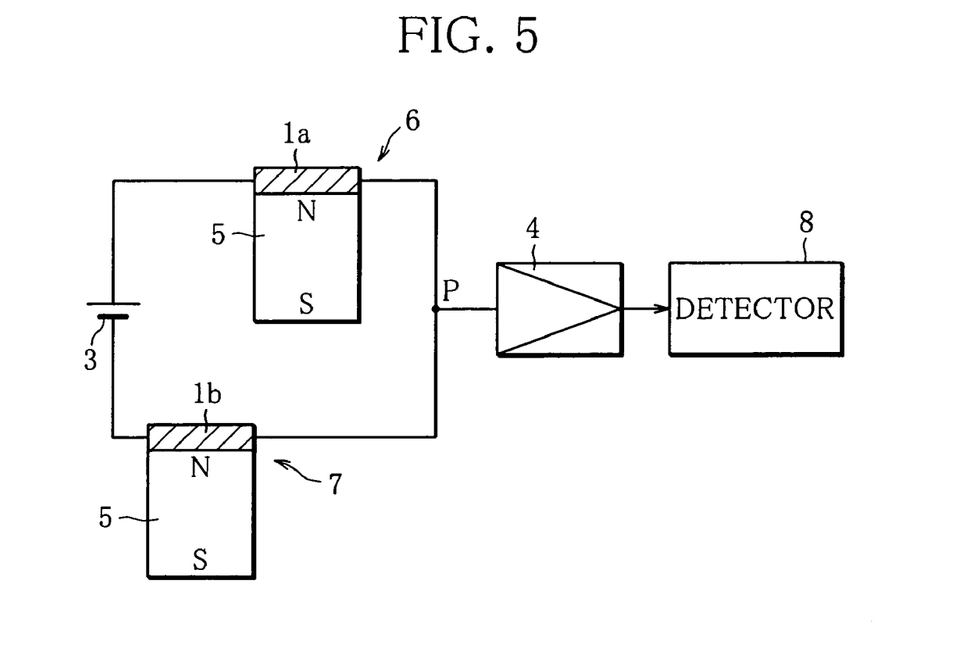
FIG. 5 is a block diagram showing a modification example of the magnetic sensor illustrated in FIG. 3.

As described above, the magnetic sensor according to the one embodiment of the invention is constructed so that the flux emitted from the single magnet 5 pierces through the pair of magneto-resistive elements $1a$ and $1b$. The magnetic sensor according to the one embodiment of the invention, however, may be constructed so that flux emitted from separate magnets 5 pierce through the magneto-resistive elements $1a$ and $1b$, for example, as shown in FIG. 5 (modification example). In this case, too, the magneto-resistive element $1a$ is caused to serve as the sensing portion 6 made to face the magnetic detecting medium S. The magneto-resistive element $1b$ should be caused to serve as the temperature-compensating portion 7 that compensates the temperature characteristic of the magneto-resistive element $1a$ of the sensing portion 6.

In the magnetic sensor obtained by modifying the embodiment in the foregoing manner, the magneto-resistive element $1b$ of the temperature-compensating portion 7 should be maintained at the same temperature as the temperature of the vicinity of the magneto-resistive element $1a$ of the sensing portion 6. By so doing, the magnetic sensor should compensate the temperature characteristic of the magneto-resistive element $1a$ using the temperature-compensating portion 7. To be concrete, the magneto-resistive element $1b$ of the temperature-compensating portion 7 is positioned farther from the magnetic detecting medium (for example, paper money) S than the magneto-resistive element $1a$ of the sensing portion 6 is. To put it briefly, the magneto-resistive element $1b$ is prevented from being affected by the magnetic substance M included in the magnetic detecting medium S. The magneto-resistive element $1b$ is maintained to have the same temperature as the temperature of the vicinity of the magneto-resistive element $1a$ of the sensing portion 6. This enables the magnetic sensor to compensate the temperature characteristic of the magneto-resistive element 1a. As a consequence, if the potential change of the common connection point P of the magneto-resistive elements 1a and 1b is detected, it is possible to detect the print pitch and width of the magnetic substance M printed on the magnetic detecting medium S, and the concentration of the magnetic substance M as well.

Since one of the serially-connected magneto-resistive elements 1a and 1b is made to serve as the sensing portion 6 to be brought close to the magnetic detecting medium S, the electric resistance value of the magneto-resistive element 1a changes only if the magnetic substance M printed on the magnetic detecting medium S approaches the sensing portion 6. For this reason, by detecting the potential change of the common connection point P of the serially-connected magneto-resistive elements 1a and 1b, it is possible to detect the presence and width of the magnetic substance M printed on the magnetic detecting medium S.

Furthermore, according to the magnetic sensor of the one embodiment of the invention, the potential of the common connection point P of the serially-connected magneto-resistive elements 1a and 1b changes in accordance with the print pitch and width of the magnetic substance M printed on the magnetic detecting medium S. This makes it possible to detect the print pitch and width of the magnetic substance M printed on the magnetic detecting medium S.

Since the flux emitted from the magnet 5 is proportional to the concentration of the magnetic substance M printed on the magnetic detecting medium S, only the electric resistance value of the magneto-resistive element 1a changes. Accordingly, the concentration of the magnetic substance M printed on the magnetic detecting medium S can be detected as a potential change signal.

Since the potential change of the common connection point P is detected in the state where the magneto-resistive elements 1a and 1b having the same characteristics are connected in series with each other, even if the ambient temperature of the magnetic sensor changes, the electric resistance values of the magneto-resistive elements 1a and 1b change in a similar manner. Therefore, the temperature change does not change the potential of the common connection point P of the magneto-resistive elements 1a and 1b. This makes it possible to counteract the temperature dependency of the magneto-resistive element 1a formed in the sensing portion 6.

It is preferable that the magneto-resistive element 1b disposed on the temperature-compensating portion 7 side be provided with a magnetic shield, not shown, in order not to be affected by the magnetic substance M printed on the magnetic detecting medium S. Of course, apart from the magnetic shielding with respect to the magneto-resistive element 1b disposed on the temperature-compensating portion 7 side, if it is possible to perform the temperature compensation of the magneto-resistive element 1a disposed on the sensing portion 6 side, the magneto-resistive element 1b may be distantly disposed in a position where it is not affected by the magnetic substance M printed on the magnetic detecting medium S.

As stated above, if the magnetic substance M printed on the magnetic detecting medium S does not affect the magneto-resistive element 1b, the detection accuracy of the magnetic substance M printed on the magnetic detecting medium S can be more reliably improved.

Embodiment 2

Figure 6:
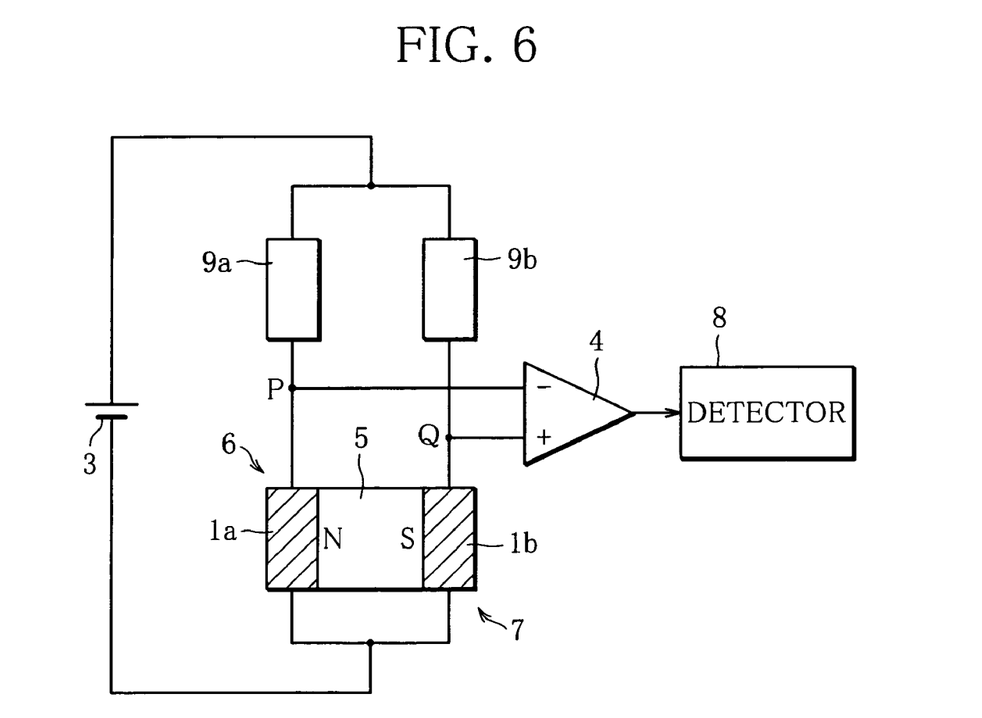
FIG. 6 is a block diagram showing a general structure of a magnetic sensor according to another embodiment of the invention.

FIG. 6 is a block diagram showing a general structure of a second embodiment (embodiment 2) of the magnetic sensor according to the invention. In this figure, identical members to those in the structure of the conventional magnetic sensor (FIG. 1A) and of the first embodiment (FIG. 3) are provided with the same reference numerals, and an explanation thereof will be roughly provided.

In this figure, 1a and 1b represent magnetic detecting elements (for example, magneto-resistive elements) having the same characteristics. Fixed resistors 9a and 9b are connected in series with the magneto-resistive elements 1a and 1b, respectively. In a pair of circuits including the magneto-resistive elements 1a and 1b and the fixed resistors 9a and 9b connected in series, open ends of the fixed resistors 9a and 9b and open ends of the magneto-resistive elements 1a and 1b are connected to each other, to thereby construct a bridge circuit. The magneto-resistive elements 1a and 1b of this bridge circuit are provided with the magnet 5 that gives magnetic biases thereto. In this bridge circuit, the magneto-resistive element 1a serves as the sensing portion 6 made to face the magnetic detecting medium S. The magneto-resistive element 1b functions as the temperature-compensating portion 7 that performs the compensation of the temperature characteristic of the magneto-resistive element 1a of the sensing portion 6.

The magnet 5 acts to give the magnetic biases to the magneto-resistive elements 1a and 1b. Two different magnets may be utilized as mentioned in embodiment [1] to give the magnetic biases to their respective magneto-resistive elements 1a and 1b. In this case, the magneto-resistive element 1b of the temperature-compensating portion 7 is placed far away from the magnetic detecting medium (for example, paper money) S so as not to be affected by the magnetic substance M included in the magnetic detecting medium S. The magneto-resistive element 1b of the temperature-compensating portion 7 is maintained to have the same ambient temperature as that of the vicinity of the magneto-resistive element 1a of the sensing portion 6. The magneto-resistive element 1b of the temperature-compensating portion 7 acts to compensate the temperature characteristic of the magneto-resistive element 1a of the sensing portion 6. The magneto-resistive element 1b of the temperature-compensating portion 7 may be formed of a pair of magneto-resistive elements having the same characteristics, instead of the fixed resistors 9a and 9b.

According to the second embodiment of the magnetic sensor of the invention thus constructed, DC voltage is applied to between a terminal connected to the fixed resistors 9a and 9b and a terminal connected to the magneto-resistive elements 1a and 1b by using the DC power source 3. Connected to connection points of the two fixed resistors 9a and 9b and their respective magneto-resistive elements 1a and 1b is the amplifier (differential amplifier) 4 that amplifies the level of potential difference (voltage value) between the two connection points. The output of the amplifier 4 is transmitted to the detector 8. The detector 8 then determines the concentration of the magnetic substance M printed on the magnetic detecting medium S from the condition (pattern) of the magnetic substance M printed on the magnetic detecting medium S as described below.

Although not particularly illustrated in a figure, the magnetic detecting medium (for example, paper money printed in magnetic ink) is brought close to the magneto-resistive element 1a of the sensing portion 6 to face the magneto-resistive element 1a of the sensing portion 6. The paper money is displaced at the prescribed speed so that the magnetic substance printed on the paper money intersects the flux emitted from the magnet 5. As a result, the flux emitted from the magnet 5 converges upon the magnetic substance printed on the paper money. Therefore, the flux that penetrates the magneto-resistive element 1*a* of the sensing portion 6 grows larger. As a result, the electric resistance value of the magneto-resistive element 1*a* is increased.

The magneto-resistive element 1*b* of the temperature-compensating portion 7 is positioned farther from the paper money than the magneto-resistive element 1*a* of the sensing portion 6 is. Accordingly, the flux of the temperature-compensating portion 7 is hardly affected by the magnetic substance printed on the paper money, so that the electric resistance value of the magneto-resistive element 1*b* of the temperature-compensating portion 7 scarcely changes. That is to say, the presence and concentration of the magnetic substance printed on the paper money is detected only by the magneto-resistive element 1*a* of the sensing portion 6.

Consequently, the potential of the P point at which the magneto-resistive element 1*a* of the sensing portion 6 and the fixed resistor 9*a* are connected to each other is raised along with the approach of the magnetic substance. The potential of the Q point at which the magneto-resistive effect element 1*b* of the temperature-compensating portion 7 and the fixed resistor 9*b* are connected to each other does not change. The potential change of the P point is amplified by the amplifier 4 and transmitted to the detector 8. It is then possible to detect an application condition and width of the magnetic substance, and the concentration of the magnetic substance M in the same manner as in embodiment 1 since the detector 8 detects the potential change signal outputted by the amplifier 4.

According to the magnetic sensor of embodiment 2 of the invention thus constructed, one of the magneto-resistive elements 1*a* and 1*b* arranged in the bridge circuit functions as the sensing portion 6 made to approach the magnetic detecting medium S. The electric resistance value of the magneto-resistive element 1*a* changes only if the area of the magnetic substance M printed on the magnetic detecting medium S approaches the sensing portion 6. In other words, the potential of the P point at which the magneto-resistive element 1*a* of the sensing portion 6 and the fixed resistor 9*a* are connected to each other is raised along with the approach of the magnetic substance, whereas the potential of the Q point at which the magneto-resistive element 1*b* of the temperature-compensating portion 7 and the fixed resistor 9*b* are connected to each other does not change. In result, by figuring out the potential difference (potential change) between the P point and the Q point, it is possible to detect the presence and width of the magnetic substance M printed on the magnetic detecting medium S, and the concentration of the magnetic substance M as well.

Furthermore, the potential of the P point at which the magneto-resistive element 1*a* of the sensing portion 6 and the fixed resistor 9*a* are connected to each other changes in accordance with the print pitch and width of the magnetic substance M printed on the magnetic detecting medium S, and the concentration of the magnetic substance M. This makes it possible to detect the print pitch and width of the magnetic substance M printed on the magnetic detecting medium S, and the concentration of the magnetic substance M.

Of course, the bridge circuit is made up of the pair of magneto-resistive elements 1*a* and 1*b* having the same characteristics. Accordingly, even in the event of a change in the ambient temperature of the magnetic sensor, the electric resistance values of the magneto-resistive elements 1*a* and 1*b* change in a similar manner. Due to the temperature change, the potentials of the common connection points P and Q of the magneto-resistive elements 1*a* and 1*b* similarly change. This makes it possible to counteract the temperature dependency of the magneto-resistive elements 1*a* and 1*b*.

More preferably, the magneto-resistive element 1*b* disposed on the temperature-compensating portion 7 side is provided with a magnetic shield, not shown, that is not affected by the magnetic substance M printed on the magnetic detecting medium S. Of course, apart from the magnetic shielding with respect to the magneto-resistive element 1*b* disposed on the temperature-compensating portion 7 side, if it is possible to carry out the temperature compensation of the magneto-resistive element 1*a* disposed on the sensing portion 6 side, the magneto-resistive element 1*b* may be disposed in a position where it is not affected by the magnetic substance M printed on the magnetic detecting medium S.

As described, by preventing the magnetic substance M printed on the magnetic detecting medium S from affecting the magneto-resistive element 1*b*, it is possible to more reliably upgrade the detection accuracy of the magnetic substance M printed on the magnetic detecting medium S.

Since one of the serially-connected magneto-resistive elements serves as the sensing portion made to face the magnetic detecting medium, only the magneto-resistive element of the sensing portion changes in the electric resistance value thereof due to the approach of the magnetic substance printed on paper money or the like. The magnetic sensor then detects the change of the electric resistance value as a potential change of the common connection point of the serially-connected magneto-resistive elements. Therefore, the magnetic sensor is capable of surely detecting the width and concentration of the magnetic substance printed on a detection subject from the change and level of an electric signal obtained by displacing the paper money or the like at the prescribed speed, in spite of the simple structure thereof.

In the magnetic sensor, one of the serially-connected magneto-resistive elements serves as the sensing portion facing the magnetic detecting medium, and the other as the temperature-compensating portion. On this account, the magnetic sensor of the invention is capable of surely detecting the print width and concentration of the magnetic substance printed on the detection subject while carrying out the temperature compensation of the magneto-resistive element, in spite of the simple structure thereof.

The magnetic sensor formed of the bridge circuit as mentioned includes the sensing portion in which one of the magneto-resistive elements is brought close to the magnetic detecting medium. The electric resistance value of the magneto-resistive element changes only if the area of the magnetic substance printed on the magnetic detecting medium approaches the sensing portion. While the potential of the point at which the magneto-resistive element of the sensing portion and the fixed resistor are connected to each other is raised along with the approach of the magnetic substance, the potential of the point at which the magneto-resistive element of the temperature-compensating portion and the fixed resistor are connected to each other does not change. As a consequence, the magnetic sensor of the invention has practically significant advantages such as a capability to detect the presence and width of the magnetic substance printed on the magnetic detecting medium (paper money and the like) by detecting the potential difference (potential change) between the connection points.

The invention claimed is:

1. A magnetic sensor comprising:

first and second fixed resistors, each of which has a first end connected with a first side of an output line of a DC power source;

a first magnetic detecting element which has a first end connected with a second side of the output line of the DC power source, and a second end connected with a second end of said first fixed resistor to function as a sensing portion adapted to face a magnetic detecting medium having a magnetic substance printed thereon;

a second magnetic detecting element which has a first end connected with the second side of the output line of the DC power source, and a second end connected with a second end of said second fixed resistor to function as a temperature-compensating portion that is not affected by the magnetic substance printed on said magnetic detecting medium;

a magnet that gives magnetic biases to said first and second magnetic detecting elements; and a detection circuit that detects a potential change between a connection point of said first fixed resistor and said first magnetic detecting element and a connection point of said second fixed resistor and said second magnetic detecting element;

wherein said detection circuit comprises a single differential amplifier, and detects a concentration of the magnetic substance printed on the magnetic detecting medium based on the detected potential change.

* * * * *